United States Patent [19]

Sano

[11] Patent Number: 4,513,252
[45] Date of Patent: Apr. 23, 1985

[54] ACTIVE LOAD CIRCUIT

[75] Inventor: Yoshiaki Sano, Yokohama, Japan

[73] Assignee: Fujitsu Limited, Kawasaki, Japan

[21] Appl. No.: 561,966

[22] Filed: Dec. 15, 1983

[30] Foreign Application Priority Data

Dec. 25, 1982 [JP] Japan .................. 57-233262

[51] Int. Cl.³ .............................. H03F 3/45
[52] U.S. Cl. ................. 330/257; 323/316; 330/288
[58] Field of Search .......... 330/257, 288; 323/315, 323/316

[56] References Cited

U.S. PATENT DOCUMENTS 4,398,160  8/1983  Neidorff .................. 330/257

Primary Examiner—James B. Mullins
Attorney, Agent, or Firm—Staas & Halsey

[57] ABSTRACT

An active load circuit including a current mirror circuit used for a load to a differential amplifier, an output transistor outputting the amplified signal in response to the differential input to the differential amplifier, and a constant current source. The current mirror circuit includes a pair of load transistors and a third transistor provided to improve the circuit stability and the amplification factor. The collector of the output transistor is connected to the emitter of the third transistor to further improve the circuit stability and the amplification factor.

3 Claims, 3 Drawing Figures

ACTIVE LOAD CIRCUIT

BACKGROUND OF THE INVENTION

1. Field of the Invention

The present invention relates to an active load circuit having improved operational stability, for example, when used as an active load circuit for a differential current amplifier.

2. Description of the Prior Art

In a prior art circuit including a differential amplifier consisting of a pair of transistors, which receive a differential input, and including a constant current source, the circuit also includes an active load circuit (or bias circuit) consisting of first (A and B) and second (C and D) pairs of transistors and a constant current source. The current output from the circuit is obtained from the current flowing from the constant current sources through the active load circuit transistors A, B, C, and D, and into and through the transistors in the differential amplifier. In the active load circuit, transistors A and B act as a current mirror circuit and an active load to the amplifier, while transistors C and D are emitter followers, i.e., their collectors are grounded, for the output stage. A disadvantage in the prior art circuit is that an offset current exists, and the circuit is balanced at a point shifted by this offset current. Another disadvantage is that a sufficient output current, i.e., a sufficient amplification factor, cannot be obtained, because of an insufficient change in the output current above the current differential.

In the above description, has been assumed that the amplification factors of transistors A, B, C and D are all equal. However, the amplification factors change, depending on the collector currents. The amplification factor has a convex curve characteristic, i.e., any increase corresponds to an increase in the factor in the collector current, that is, the curve reaches a predetermined value and then decreases. Thus, to make the amplification factors of transistors A, B, C and D all equal, the operation current for these transistors must also be made equal. The amplification factors of transistors A and B can be made equal by regulating their collector currents. This collector current regulation is effected by adjusting the constant current source. The amplification factor of transistor D can also be made equal to those of transistors A and B by regulating D's collector current through adjustments to the constant current source. However, the collector current of transistor C is small, because it is the sum of the base currents of transistors A and B, and it is difficult to adjust the amplification factor of transistor C as equal to those of transistors A, B and D, even if the characteristic of transistor C is equal to those of transistors A, B and D.

As can be seen from the above description, the offset current in this prior art circuit will be greater than required, and thus the circuit will probably become more unbalanced.

SUMMARY OF THE INVENTION

An object of the present invention is to provide an active load circuit which can improve operational stability and increase the value of the output current as compared to the input current, i.e. the gain, without increasing the member of circuit elements and using a simple structure.

According to the present invention, there is provided an active load circuit including: first and second transistors whose emitters are connected to a voltage source, and a third transistor whose emitter is connected to the bases of the first and second transistors and whose base is connected to one of the collectors of the first and second transistors to cause equal collector currents to flow in the first and second transistors. Also included is a fourth transistor whose collector is connected to the emitter of the third transistor and whose base is connected to the other of the collectors of the first and second transistors, and a constant current source connected to the emitter of the fourth transistor.

According to the present invention, there is also provided, an amplifier circuit including: a first and second transistors whose emitters are connected to a voltage source line and a third transistor whose emitter is connected to the bases of the first and second transistors and whose base is connected to one of the collectors of the first and second transistors to cause the equal collector currents of the first and second transistors to flow. Further included is a fourth transistor whose collector is connected to the emitter of the third transistor and whose base is connected to the other of the collectors of the first and second transistors, a first constant current source connected to the emitter of said fourth transistor, and a current control device having first and second current sources respectively connected to the collectors of the first and second transistors, difference of currents of the first and second current sources being varied in response to an input signal.

BRIEF DESCRIPTION OF THE DRAWINGS

Other objects and features of the present invention will be clearly understood with reference to the accompanying drawings, in which.

DESCRIPTION OF THE PREFERRED EMBODIMENTS

Figure 1:
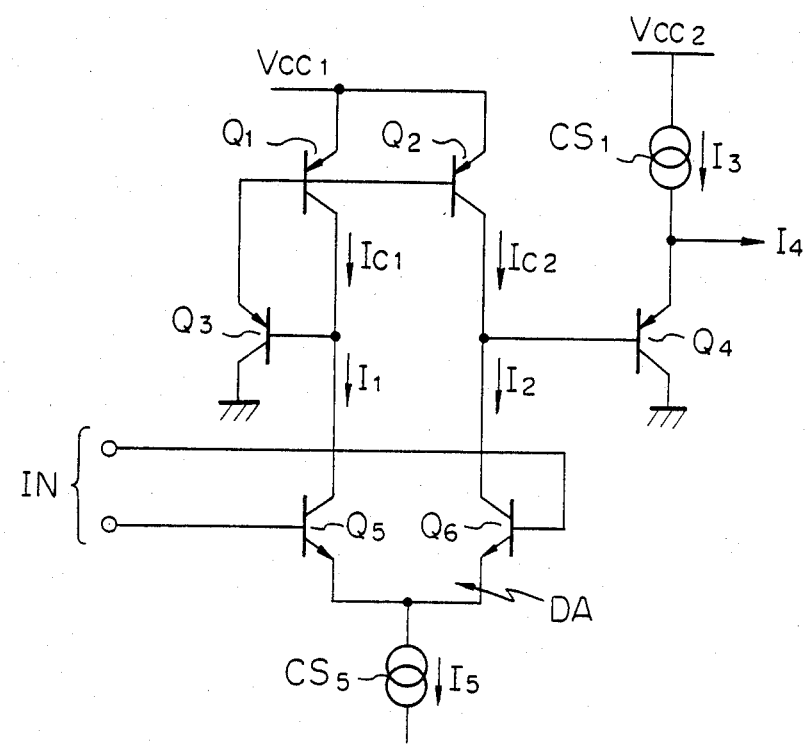
FIG. 1 is a prior art active load circuit.

Before describing the preferred embodiments of the present invention, it is necessary to describe in detail an example of a prior art circuit with reference to FIG. 1, to ensure a clearer understanding of the advantages of the present invention.

FIG. 1 is a diagram of a prior art active load circuit. The circuit includes a differential amplifier DA consisting of a pair of transistors $Q_5$ and $Q_6$ which receive a differential input IN, and a constant current source $CS_5$. The circuit also includes an active load circuit (or bias circuit) consisting of transistors $Q_1$ to $Q_4$ and a constant current source $CS_1$. The circuit in FIG. 1 provides an output current $I_4$ based on the currents $I_1$ and $I_2$ which flow between the transistors $Q_5$ and $Q_6$ and the active load circuit. The transistors $Q_1$ to $Q_3$ form a current mirror circuit and act as an active load to the amplifier DA. The transistor $Q_4$ is an emitter follower for the output stage, i.e., its collector is grounded, as is a collector of the transistor $Q_3$.

When each of the current amplification factors of the pnp transistors $Q_1$ to $Q_4$ is $\beta$, the emitter current $I_E$ of the pnp transistors $Q_1$ to $Q_4$, base currents $I_B$, and collector currents $I_C$ have the following relationships:

$$I_B = \frac{I_C}{\beta} = \frac{I_E}{1+\beta}, \text{ and}$$

$$I_C = \beta I_B = \frac{\beta}{1+\beta} I_E.$$

Therefore, the currents $I_1$ and $I_2$ flowing to the transistors $Q_5$ and $Q_6$ are defined as in the following equations (1) and (2):

$$I_1 = I_{C1} + (I_{C1} + I_{C2}) \frac{1}{(\beta+1)\beta} \quad (1)$$

$$I_2 = I_{C2} + (I_3 - I_4) \frac{1}{\beta+1} \quad (2)$$

In the above equations, $I_{C1}$ and $I_{C2}$ are collector currents of transistors $Q_1$ and $Q_2$ and are equal due to the current mirror circuit principle, that is $$I_{C1} = I_{C2} = I_C.$$

Accordingly, the following equation (3) is derived from the above equations (1) and (2).

$$I_1 - I_2 = \frac{2}{\beta(\beta+1)} I_C - \frac{1}{\beta+1}(I_3 - I_4) \quad (3)$$

As can be clearly understood from equation (3), the output current $I_4$ does not equal the current $I_3$ of the current source $CS_1$ even if $I_1=I_2$, i.e., the differential input IN is zero. In addition, the following equation (4) is derived from the equation (3) when $I_1$ equals $I_2$:

$$I_4 = I_3 - \frac{2}{\beta} I_C \quad (4)$$

In this circuit of FIG. 1, an offset current in equation (4) exists, in other words, the circuit is balanced at a point shifted by the offset current. This is a disadvantage of the above-described prior art circuit.

Another disadvantage of the circuit is that sufficient output current $I_4$ cannot be obtained, i.e., a sufficient amplification factor cannot be obtained, because the change of the output current $I_4$ becomes only above $\beta$ times the current difference $(I_1-I_2)$, normally $\beta$ is several tens.

In the above description, it is assumed that the amplification factor $\beta$ of all of the transistors $Q_1$ to $Q_4$ is equal, however, in actual practice, the amplification factor $\beta$ changes, depending on the collector current. The amplification factor $\beta$ has a convex curve characteristic, i.e., any increase in the amplification factor corresponds to an increase in the collector current, that is, the curve reaches a predetermined maximum value and then decreases. Therefore, in order to make all of the transistors' amplification factors equal, the operating currents of all of the transistors must also be made equal. The amplification factors of transistors $Q_1$ and $Q_2$ can be made equal by regulating their collector currents. This collector current regulation is effected by adjusting the constant current source $CS_5$. The amplification factor of the transistor $Q_4$ can also be made equal to that of the transistors $Q_1$ and $Q_2$ by regulating the collector current for $Q_4$ by adjusting the constant current source $CS_1$. On the other hand, the collector current of the transistor $Q_3$ is small, because it is the sum of the base currents of the transistors $Q_1$ and $Q_2$, thus it is difficult to adjust the amplification factor $\beta$ of the transistor $Q_3$ to be equal to that of the transistors $Q_1$, $Q_2$ and $Q_4$, even if the characteristic of the transistor $Q_3$ is equal to that of transistors $Q_1$, $Q_2$ and $Q_4$. This means the equation (3) cannot be realized in actual practice. As can be seen from the above description, the actual offset current in this prior art circuit is greater than that shown by equation (3), and thus the circuit shown in FIG. 1 may become even more unbalanced.

Figure 2:
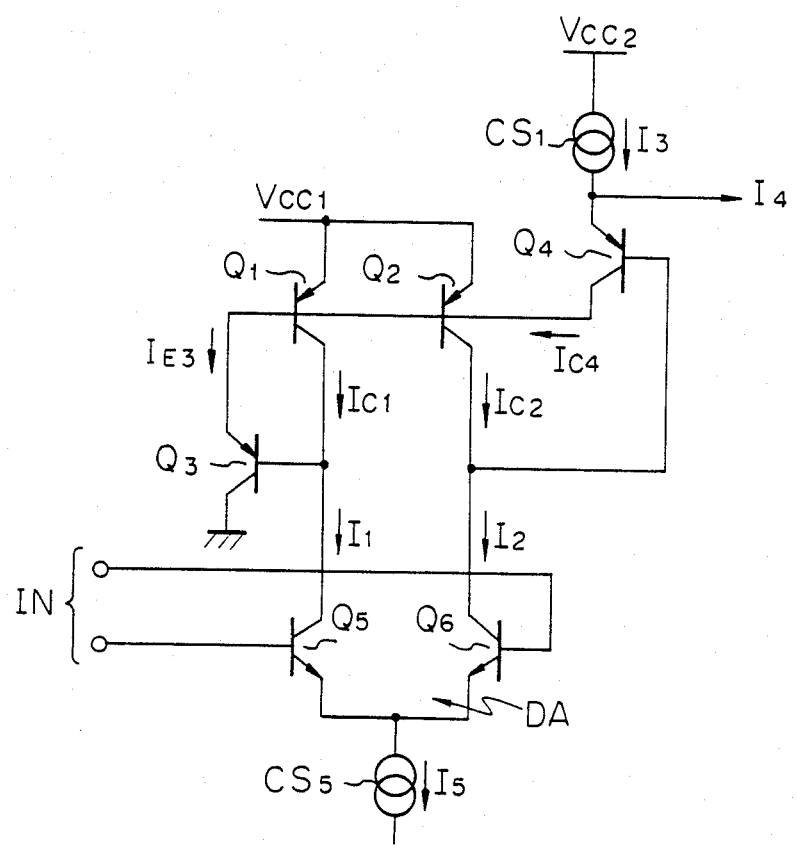
FIG. 2 is an embodiment of the active load circuit according to the present invention.

FIG. 2 is a diagram of an embodiment of an active load circuit according to the present invention. In FIG. 2, the transistors $Q_1$, $Q_2$ and $Q_3$ forming the current mirror circuit are the same as those shown in FIG. 1. The transistors $Q_5$ and $Q_6$ and the constant current source $CS_5$ forming the differential amplifier circuit (DA) are also the same as those shown in FIG. 1. The constant current source $CS_1$ is the same as that in FIG. 1, and the transistor $Q_4$ is the same as that in FIG. 1, with the exception that its collector is connected to the emitter of the transistor $Q_3$, instead of forming the emitter-follower circuit, i.e., grounding the collector of transistor $Q_4$.

According to the circuit connection shown in FIG. 2, the collector current $I_{C4}$ of the transistor $Q_4$ flows to the emitter of the transistor $Q_3$, whereby, operating currents of the transistors $Q_3$ and $Q_4$ are made equal.

As mentioned previously in the description of a prior art circuit, the amplification factors $\beta$ of transistors $Q_1$ to $Q_4$ vary, depending on the collector currents. In order to make the amplification factors of transistors $Q_1$ to $Q_4$ equal, the operational collector currents of the transistors must also be made equal. The collector currents of transistors $Q_1$ and $Q_2$ are regulated by adjusting the constant current source $CS_5$. The collector current $I_{C4}$ of transistor $Q_4$ is regulated by adjusting the constant current source $CS_1$. The value of the emitter current $I_{E3}$ of transistor $Q_3$ is approximately equal to the value of the collector current $I_{C4}$, in accordance with the connection shown in FIG. 2. Therefore, all of the operation currents of transistors $Q_1$ to $Q_4$ can be made equal, i.e., all of the amplification factors $\beta$ of transistors $Q_1$ to $Q_4$ can be made equal. Therefore, the following equations are defined:

$$I_{C4} = (I_3 - I_4) \frac{\beta}{\beta+1} \quad (5)$$

$$I_2 = I_{C2} + (I_3 - I_4) \frac{\beta}{\beta+1} \quad (6)$$

$$I_{E3} = I_{C4} + (I_{C1} + I_{C2}) \frac{1}{\beta} \text{ and,} \quad (7)$$

$$I_1 = I_{C1} + I_{E3} \frac{1}{\beta+1} \quad (8)$$

Assuming the following relationship as mentioned in the prior art circuit:

$$I_{C1} = I_{C2} = I_C$$

and substituting this into the above equations (5) to (8), the following equation can be derived from equations (5), (7) and (8):

$$I_1 = \left(1 + \frac{2}{(\beta+1)\beta}\right) I_C + \frac{\beta}{(\beta+1)^2}(I_3 - I_4) \quad (9)$$

and a further equation can be derived from equation (6):

$$I_2 = I_C + \frac{1}{(\beta + 1)} (I_3 - I_4) \qquad (10)$$

Finally, the following equation corresponding to equation (3) of the prior art circuit can be obtained:

$$I_1 - I_2 = \frac{2}{(\beta + 1)\beta} I_C - \frac{1}{(\beta + 1)^2} (I_3 - I_4) \qquad (11)$$

Equation (11) in accordance with the present invention proves that the output current $I_4$ is increased to approximately the order of $\beta^2$. Considering the difference between the equations (11) and (3), the gain of the output current $I_4$ to the differential inputs in accordance with the present invention is greater by approximately $\beta$ times that of the prior art circuit shown in FIG. 1. In addition, the following equation (12) is derived from equation (11) when $I_1$ is equal $I_2$:

$$I_4 = I_3 - \left(1 + \frac{1}{\beta}\right) 2I_C \qquad (12)$$

Considering the difference between the equations (4) and (12), the offset term of the present invention is smaller by $2I_C$ than that of the prior art circuit, whereby the operational stability of the circuit is increased.

The above embodiment with reference to FIG. 2 is an example of an active load circuit for a differential amplifier circuit (DA). The present invention, however, can be applied to other embodiments.

Figure 3:
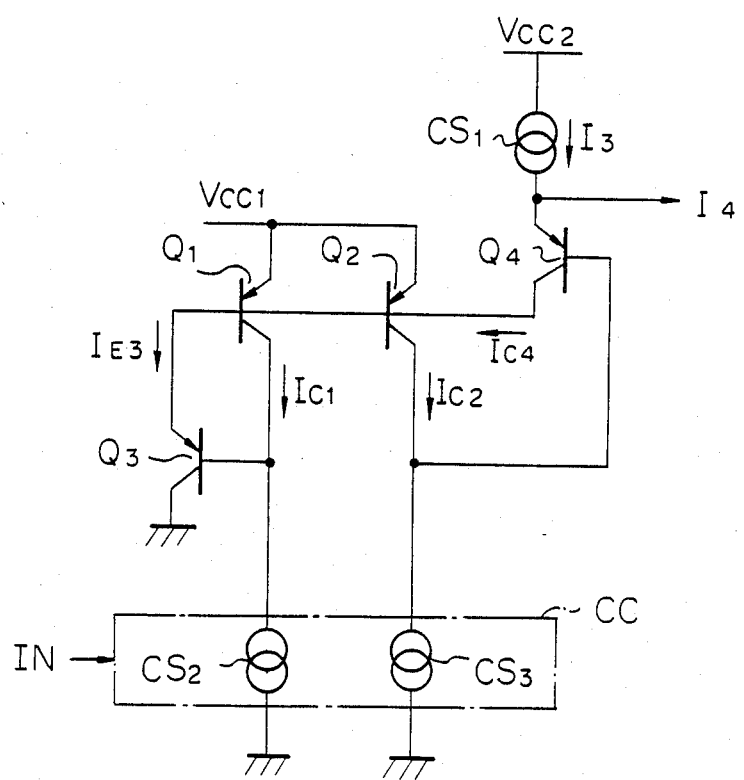
FIG. 3 is another embodiment of the active load circuit according to the present invention.

FIG. 3 is a general circuit diagram in accordance with the present invention. The applifier circuit shown in FIG. 3 comprises current control means CC consisting of current sources $CS_2$ and $CS_3$, instead of the amplifier DA and the active load circuit mentioned above with reference to FIG. 2. The difference current between the currents $CS_2$ and $CS_3$ is controlled by the input signal IN.

The amplifier circuit shown in FIG. 3 provides a high amplification factor and high operational stability.

I claim:
1. An active load circuit, comprising:
   first and second transistors each having an emitter connected to a voltage source and each having a collector and a base;
   a third transistor having an emitter connected to the bases of said first and second transistors and a base connected to one of the collectors of said first and second transistors, causing equal collector currents to flow in said first and second transistors;
   a fourth transistor having a collector connected to the emitter of said third transistor, a base connected to the other of the collectors of said first and second transistors, and an emitter; and
   a constant current source connected to the emitter of said fourth transistor.
2. An amplifier circuit, comprising:
   first and second transistors each having an emitter connected to a voltage source and each having a collector and a base;
   a third transistor having an emitter connected to the bases of said first and second transistors and a base connected to one of the collectors of said first and second transistors, causing equal collector currents to flow in the first and second transistors;
   a fourth transistor having a collector connected to the emitter of said third transistor, a base connected to the other of the collectors of said first and second transistors, and an emitter;
   a first constant current source connected to the emitter of said fourth transistor; and
   current control means having first and second current sources respectively connected to the collectors of said first and second transistors, for varying a difference in currents produced by said first and second current sources in response to an input signal.
3. An amplifier circuit according to claim 2, wherein said first and second current sources comprise:
   a pair of transistors each having an emitter, each having a base for receiving a differential input signal, and each having a collector respectively connected to said first and second transistors; and
   a second constant current source connected to the emitters of said pair of transistors.

* * * * *

UNITED STATES PATENT AND TRADEMARK OFFICE
CERTIFICATE OF CORRECTION

PATENT NO. : 4,513,252
DATED : April 23, 1985
INVENTOR(S) : YOSHIAKI SANO

It is certified that error appears in the above-identified patent and that said Letters Patent is hereby corrected as shown below:

Col. 1, line 32, before "has" insert --it--;

line 37, after "crease" insert --in the factor--;

delete "factor in the";

line 65, "member" should be --number--;

line 68, delete ":".

Col. 2, line 15, after "line" insert --,--.

Col. 4, line 24, after "whereby," insert --the--.

Signed and Sealed this

Tenth Day of September 1985

[SEAL]

Attest:

DONALD J. QUIGG

Attesting Officer    Acting Commissioner of Patents and Trademarks - Designate